United States Patent
Zhou et al.

(10) Patent No.: US 10,128,337 B2
(45) Date of Patent: Nov. 13, 2018

(54) METHODS FOR FORMING FIN STRUCTURES WITH DESIRED PROFILE FOR 3D STRUCTURE SEMICONDUCTOR APPLICATIONS

(71) Applicant: Applied Materials, Inc., Santa Clara, CA (US)

(72) Inventors: Jie Zhou, San Jose, CA (US); Zhong Qiang Hua, Saratoga, CA (US); Chentsau Ying, Cupertino, CA (US); Srinivas D. Nemani, Sunnyvale, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/173,234

(22) Filed: Jun. 3, 2016

(65) Prior Publication Data
US 2017/0352726 A1    Dec. 7, 2017

(51) Int. Cl.
| | |
|---|---|
| *H01L 21/308* | (2006.01) |
| *H01L 29/08* | (2006.01) |
| *H01L 29/66* | (2006.01) |
| *H01L 29/78* | (2006.01) |
| *H01L 29/04* | (2006.01) |
| *H01L 21/02* | (2006.01) |
| *H01L 21/3065* | (2006.01) |
| *H01L 21/324* | (2006.01) |
| *H01L 21/67* | (2006.01) |
| *H01L 21/677* | (2006.01) |

(52) U.S. Cl.
CPC ...... *H01L 29/0847* (2013.01); *H01L 21/0262* (2013.01); *H01L 21/02532* (2013.01); *H01L 21/02587* (2013.01); *H01L 21/02639* (2013.01); *H01L 21/02664* (2013.01); *H01L 21/308* (2013.01); *H01L 21/3065* (2013.01); *H01L 21/324* (2013.01); *H01L 21/67115* (2013.01); *H01L 21/67742* (2013.01); *H01L 21/67766* (2013.01); *H01L 29/045* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 9,177,820 B2 | 11/2015 | Bergendahl et al. | |
| 2005/0167394 A1* | 8/2005 | Liu | H01L 21/0276 216/41 |

(Continued)

*Primary Examiner* — Charles Garber
*Assistant Examiner* — Alia Sabur
(74) *Attorney, Agent, or Firm* — Patterson + Sheridan, LLP

(57) ABSTRACT

Methods for forming fin structures with desired profile and dimensions for three dimensional (3D) stacking of fin field effect transistor (FinFET) for semiconductor chips are provided. The methods include a structure reshaping process to reshape a shaped structure, such as a diamond like structure formed on a fin structure. In one embodiment, a method for forming a structure on a substrate includes performing an epitaxial deposition process to form a shaped structure on a fin structure disposed on a substrate, performing a mask layer deposition process to form a mask layer having a first width on the shaped structure, and performing a mask trimming process to trim the mask layer from the first width from a second width.

19 Claims, 8 Drawing Sheets

(56) References Cited

U.S. PATENT DOCUMENTS

| | | | |
|---|---|---|---|
| 2007/0077524 A1 | 4/2007 | Koh et al. | |
| 2007/0196011 A1* | 8/2007 | Cox | G01N 21/33 |
| | | | 382/145 |
| 2009/0004875 A1* | 1/2009 | Shen | H01L 21/0337 |
| | | | 438/735 |
| 2010/0291713 A1* | 11/2010 | Lee | H01L 21/02115 |
| | | | 438/5 |
| 2014/0134814 A1* | 5/2014 | Wong | H01L 21/82341 |
| | | | 438/283 |
| 2015/0151329 A1 | 6/2015 | Kawanishi et al. | |
| 2016/0071956 A1* | 3/2016 | Balakrishnan | H01L 29/66818 |
| | | | 257/401 |
| 2016/0211352 A1* | 7/2016 | Chuang | H01L 29/66795 |

\* cited by examiner

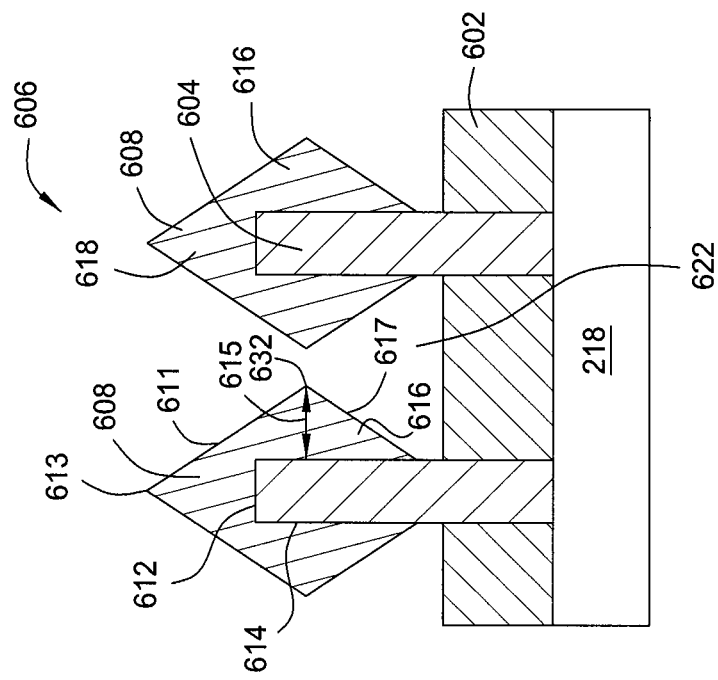
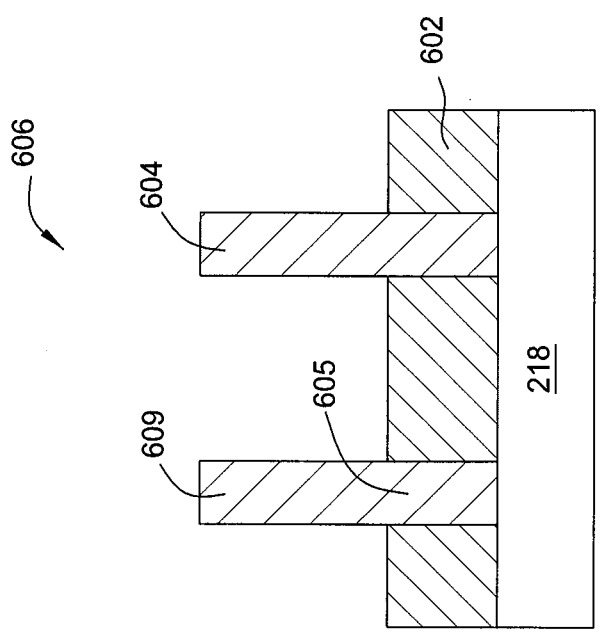

METHODS FOR FORMING FIN STRUCTURES WITH DESIRED PROFILE FOR 3D STRUCTURE SEMICONDUCTOR APPLICATIONS

BACKGROUND

Field

Embodiments generally relate to methods for forming three dimension structures with desired profiles on a semiconductor substrate. More specifically, embodiments relate to methods for forming three dimension structures on a semiconductor substrate with desired profiles by a structure reshaping process for fin field effect transistor (FinFET) semiconductor manufacturing applications.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As circuit densities increase for next generation devices, the widths of interconnects, such as vias, trenches, contacts, gate structures and other features, as well as the dielectric materials therebetween, decrease to 45 nm and 32 nm dimensions, whereas the thickness of the dielectric layers remain substantially constant, with the result of increasing the aspect ratios of the features. In order to enable the fabrication of next generation devices and structures, three dimensional (3D) stacking of features in semiconductor chips is often utilized. In particular, fin field effect transistors (FinFET) are often utilized to form three dimensional (3D) structures in semiconductor chips. By arranging transistors in three dimensions instead of conventional two dimensions, multiple transistors may be placed in the integrated circuits (ICs) very close to each other. Recently, complementary metal oxide semiconductor (CMOS) FinFET devices have been widely used in many logic and other applications and are integrated into various different types of semiconductor devices. FinFET devices typically include semiconductor fins with high aspect ratios in which the channel and source/drain regions for the transistor are formed thereover. A gate electrode is then formed over and along side of a portion of the fin utilizing the advantage of the increased surface area of the channel and source/drain regions to produce faster, more reliable and better-controlled semiconductor transistor devices. Further advantages of FinFETs include reduced short channel effect and higher current flow.

FIG. 1A depicts an exemplary embodiment of a fin field effect transistor (FinFET) 150 disposed on a substrate 100. The substrate 100 may be a silicon substrate, a germanium substrate, or a substrate formed from other semiconductor materials. In one embodiment, the substrate 100 may include p-type or n-type dopants doped therein. The substrate 100 includes a plurality of semiconductor fins 102 formed thereon isolated by shallow trench isolation (STI) structures 104. The shallow trench isolation (STI) structures 104 may be formed by an insulating material, such as a silicon oxide material, a silicon nitride material or a silicon carbon nitride material.

The substrate 100 may include a portion in NMOS device region 101 and a portion in PMOS device region 103 as needed, and each of the semiconductor fins 102 may be sequentially and alternatively formed in the NMOS device region 101 and the PMOS device region 103 in the substrate 100. The semiconductor fins 102 are formed protruding above the top surfaces of the shallow trench isolation (STI) structures 104. An epi-grown diamond-like structure 132, 134 may be formed as part of the fin structure 102 having a proper distance 162 defined in between. Subsequently, a gate structure 106, typically including a gate electrode layer disposed on a gate dielectric layer, is deposited on both of the NMOS device region 101 and the PMOS device region 103 and over the diamond-like structures 132, 134 over the semiconductor fins 102.

The gate structure 106 may be patterned to expose portions 148, 168 of diamond-like structures 132, 134 over the semiconductor fins 102 uncovered by the gate structure 106. The exposed portions 148, 168 of the diamond-like structures 132, 134 may then be doped with dopants to form lightly doped source and drain (LDD) regions using an implantation process.

FIG. 1B depicts a cross sectional view of the substrate 100 including the plurality of the diamond-like structures 132, 134 formed over the semiconductor fins 102 on the substrate 100 isolated by the shallow trench isolation (STI) structures 104. The diamond-like structures 132, 134 are formed due to different growth rate on different crystal surface planes or orientations from the underlying fin structure 102. For example, the growth rate on a silicon surface with <111> orientation may be slower than other planes, such as <110> or <100> orientations. As such, as different growth rates may be occurred at different surfaces of the fin structure 102, the diamond-like structures 132, 134 formed thereon may have a wider horizontal width 154 at a lateral portion 156 than a vertical length 146 formed on a top portion 152 of the diamond-like structures 132, 134. As the deposition process proceeds, the lateral portion 156 of the diamond-like structures 132, 134 may be undesirably merged, forming an overlapping portion 158 blocking a channel 160 defined between the fin structures 102. Undesired early close-up between the diamond-like structures 132, 134 between the fin structures 102 often results in an inability to form channels 160 with proper and desired electrical performance, resulting in device failure and deformed device structure.

Thus, there is a need for improved methods for forming fin structures with desired profile suitable for three dimensional (3D) stacking of semiconductor chips or other semiconductor devices.

SUMMARY

Methods for forming fin structures with desired profile and dimensions for three dimensional (3D) stacking of fin field effect transistor (FinFET) for semiconductor chips are provided. The methods include a structure reshaping process to reshape a shaped structure, such as a diamond like structure formed on a fin structure. In one embodiment, a method for forming a structure on a substrate includes performing an epitaxial deposition process to form a shaped structure on a fin structure disposed on a substrate, performing a mask layer deposition process to form a mask layer having a first width on the shaped structure, and performing a mask trimming process to trim the mask layer from the first width from a second width.

In another embodiment, a method for forming a structure on a substrate includes forming an etching stop layer in a structure disposed on a substrate by an ion implantation process, performing a remote plasma etching process to etch the structure until reaching the etching stop layer, defining openings exposing of the etching stop layer of the structure, and performing a selective deposition process to form a material layer in the openings and on the etching stop layer.

In yet another embodiment, a method for forming a structure on a substrate includes performing a directional ion plasma process on a structure formed on a substrate to form an etching stop layer in the structure, wherein the structure is formed on the substrate between shallow trench isolation structures fabricated from insulating materials, performing a remote plasma etching process including hydrogen radicals to etch a portion of the structure until reaching the etching stop layer exposing an underlying portion of the structure; and performing a selective deposition process to form a material layer on the underlying portion of the structure.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 6A-6F depict one embodiment of a sequence for forming form FINFET devices with desired structure profile during a manufacturing process, for example, such as the process depicted in FIG. 5.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Methods for forming structures with desired profile and dimensions for three dimensional (3D) stacking of fin field effect transistor (FinFET) for semiconductor devices are provided. The methods utilize a structure reshaping process to reshape the dimension and profile of a shaped structure formed on a fin structure for fin field effect transistor (FinFET) devices. The shaped structure may include a diamond like structure formed on a fin structure, a gate structure, or any suitable structure in semiconductor devices, particularly for three dimensional (3D) stacking of fin field effect transistor (FinFET) semiconductor structures. In one embodiment, the structure reshaping process is performed to reshape the shaped structure, such as the diamond like structure, formed on a fin structure so as to form a desired profile for the fin field effect transistor (FinFET) devices. The structure reshaping process may include a mask layer deposition process and a mask trimming process to trim the mask to a desired profile so as to assist transfer pattern/feature to the diamond like structure with desired profile/dimensions.

Figure 2:
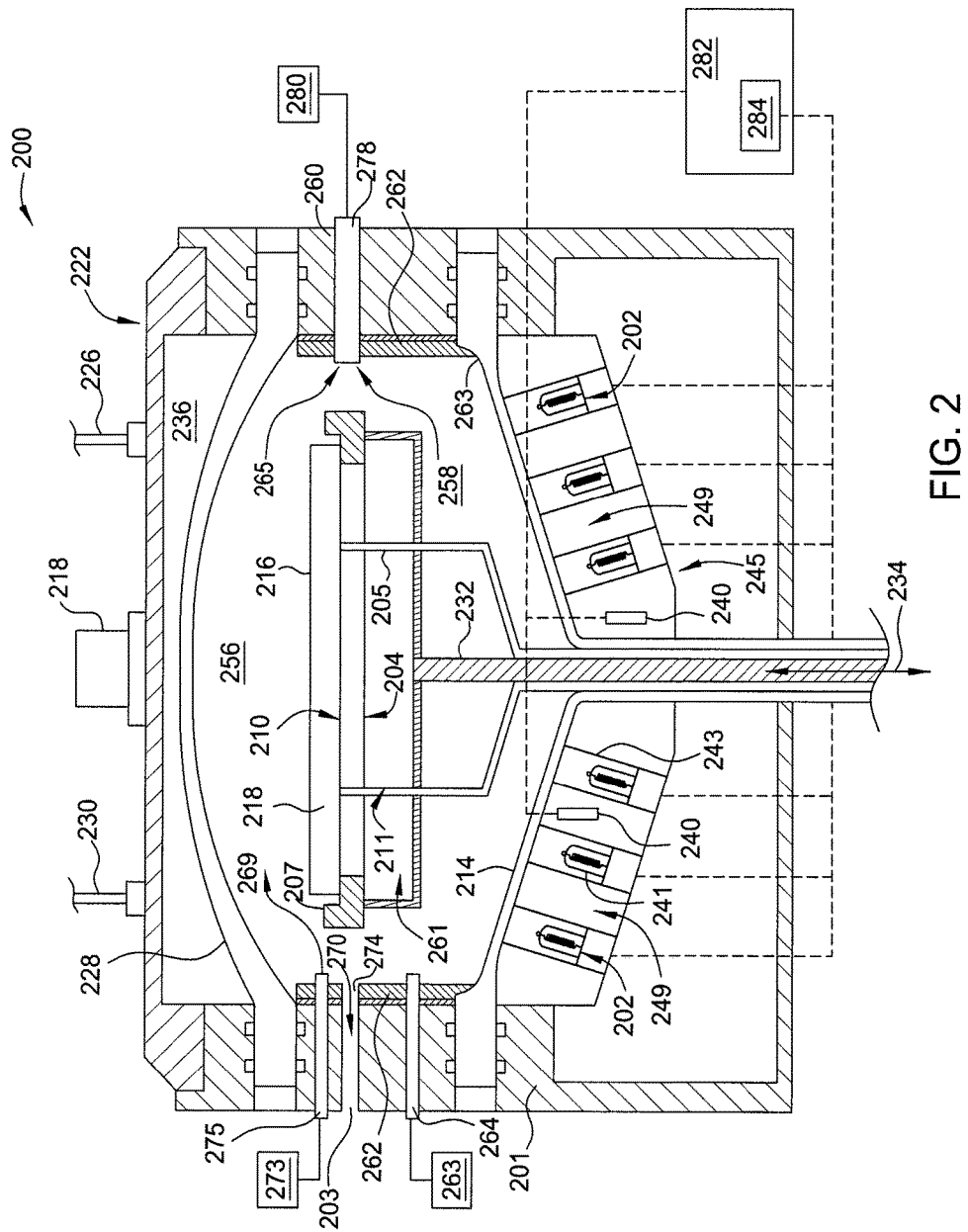
FIG. 2 depicts an apparatus configured to perform an epitaxial deposition process to form a structure on a substrate.

FIG. 2 is a schematic sectional view of a processing chamber 200 that may be utilized to perform an epitaxial deposition process. Suitable processing chambers that may be adapted for use with the teachings disclosed herein include, for example, an Epi® processing chamber available from Applied Materials, Inc. of Santa Clara, Calif. Although the processing chamber 100 is shown including a plurality of features that enable superior deposition performance, it is contemplated that other processing chambers may be adapted to benefit from one or more of the inventive features disclosed herein.

The processing chamber 200 may be used to process one or more substrates, including deposition of a material on an upper surface of a substrate, such as an upper surface 216 of a substrate 218 depicted in FIG. 2. The processing chamber 200 includes a chamber body 201 connected to, an upper dome 228 and a lower dome 214. In one embodiment, the upper dome 228 may be fabricated from a material such as a stainless steel, aluminum, or ceramics. Suitable ceramic include quartz, including bubble quartz (e.g., quartz with fluid inclusions), alumina, yttria, or sapphire. The upper dome 228 may be thermally controlled by introducing a thermal control fluid, such as a cooling gas, through an inlet portal 226 into a thermal control space 236, and withdrawing the thermal control fluid through an exit portal 230. In some embodiments, a cooling gas circulating through the thermal control space 236 may reduce deposition on an inner surface of the upper dome 228.

An array of radiant heating lamps 202 is disposed below the lower dome 214 for heating, among other components, a backside 204 of a substrate support 207 disposed within the processing chamber 200. During deposition, the substrate 218 may be brought into the processing chamber 200 and positioned onto the substrate support 207 through a loading port 203. The lamps 202 are adapted to the heat the substrate 218 to a predetermined temperature to facilitate thermal decomposition of process gases supplied into the processing chamber to deposit a material on onto the upper surface 216 of the substrate 218. The lamps 202 may be adapted to heat the substrate 218 to a temperature of about 300 degrees Celsius to about 1200 degrees Celsius, such as about 300 degrees Celsius to about 950 degrees Celsius.

The lamps 202 may include bulbs 241 surrounded by an optional reflector 243 disposed adjacent to and beneath the lower dome 214 to heat the substrate 218 as the process gas passes thereover to facilitate the deposition of the material onto the upper surface 216 of the substrate 218. The lamps 202 are arranged in annular groups of increasing radius around a shaft 232 of the substrate support 207. The shaft 232 is formed from quartz and contains a hollow portion or cavity therein, which reduces lateral displacement of radiant energy near the center of the substrate 218, thus facilitating uniform irradiation of the substrate 218. In one embodiment, each lamp 202 is coupled to a power distribution board (not shown) through which power is supplied to each lamp 202. The lamps 202 are positioned within a lamphead 245 which may be cooled during or after processing by, for example, a cooling fluid introduced into channels 249 located between the lamps 202. The lamphead 245 conductively cools the lower dome 214 due in part to the close proximity of the lamphead 245 to the lower dome 214. The lamphead 245 may also cool the lamp walls and walls of the reflectors 243. If desired, the lampheads 245 may be in contact with the lower dome 214.

The substrate support 207 is shown in an elevated processing position, but may be moved vertically by an actuator (not shown) to a loading position below the processing position to allow lift pins 205 to contact the lower dome 214. The lift pins 205 pass through holes 211 in the substrate support 207 and raise the substrate 108 from the substrate support 207. The substrate support 207 disposed in the processing chamber 200 divides the internal volume of the processing chamber 200 into a process gas region 256 (above the front side 210 of the substrate support 207) and a purge gas region 258 (below the substrate support 207). The substrate support 207 is rotated during processing by a central shaft 232 to minimize the effects of thermal and process gas flow spatial non-uniformities within the processing chamber 200, and thus facilitate uniform processing of the substrate 218. The substrate support 207 is supported by the central shaft 232, which moves the substrate 218 in an up and down direction 234 during loading and unloading, and in some instances, during processing of the substrate 218. The substrate support 207 may be formed from a material having low thermal mass or low heat capacity, so that energy absorbed and emitted by the substrate support 207 is minimized. The substrate support 207 may be formed from silicon carbide or graphite coated with silicon carbide to absorb radiant energy from the lamps 202 and rapidly conduct the radiant energy to the substrate 218.

A liner assembly 262 may be disposed within the chamber body 201 and is surrounded by the inner circumference of the base plate 260. The liner assembly 262 may be formed from a process-resistant material and generally shields the processing volume (i.e., the process gas region 256 and purge gas region 258) from metallic walls of the chamber body 201. An opening 270, such as a slit valve, may be disposed through the liner assembly 262 and aligned with the loading port 203 to allow for passage of the substrate 218.

An optical pyrometer 219 may be disposed at a region above the upper dome 228. The optical pyrometer 219 measures a temperature of the upper surface 216 of the substrate 218. A reflector 222 may be optionally placed outside the upper dome 228 to reflect infrared light that is radiating from the substrate 218 or transmitted by the substrate 218 back onto the substrate 218. The reflector 222 can be made of a metal such as aluminum, gold or stainless steel. The reflector 222 can have the inlet portal 226 and exit portal 230 to carry a flow of a fluid such as water for cooling the reflector 222.

A plurality of thermal radiation sensors 240, which may be pyrometers or light pipes, such as sapphire light pipes, may be disposed in the lamphead 245 for measuring thermal emissions of the substrate 218. The sensors 240 are typically disposed at different locations in the lamphead 245 to facilitate viewing (i.e., sensing) different locations of the substrate 218 during processing.

Process gas supplied from a process gas supply source 273 is introduced into the process gas region 256 through a process gas inlet port 275 formed in the sidewall of the base plate 260. The process gas inlet port 275 is configured to direct the process gas in a generally radially inward direction. The process gas exits the process gas region 256 (along flow path 265) through a gas outlet port 278 located on the opposite side of the processing chamber 200 relative to the process gas inlet port 275. Removal of the process gas through the gas outlet port 278 may be facilitated by a vacuum pump 280 coupled thereto. Purge gas supplied from a purge gas source 263 is introduced to the purge gas region 258 through a purge gas inlet port 264 formed in the sidewall of the base plate 260. During the film formation process, the substrate support 207 is located at a position such that the purge gas flows along flow path 261 across a back side 204 of the substrate support 207. The purge gas exits the purge gas region 258 and is exhausted out of the process chamber through the gas outlet port 278 located on the opposite side of the processing chamber 200 relative to the purge gas inlet port 264.

During processing, a controller 282 receives data from the sensors 240 and separately adjusts the power delivered to each lamp 202, or individual groups of lamps or lamp zones, based on the data. The controller 282 may include a power supply 284 that independently powers the various lamps 202 or lamp zones. The controller 282 can be configured to produce a desired temperature profile on the substrate 218, and based on comparing the data received from the sensors 240, the controller 282 may adjust the power to lamps and/or lamp zones to conform the observed (i.e., sensed) thermal data indicating of the lateral temperature profile of the substrate with to the desired temperature profile. The controller 282 may also adjust power to the lamps and/or lamp zones to conform the thermal treatment of one substrate to the thermal treatment of another substrate, to prevent chamber performance drift over time.

Figure 3:
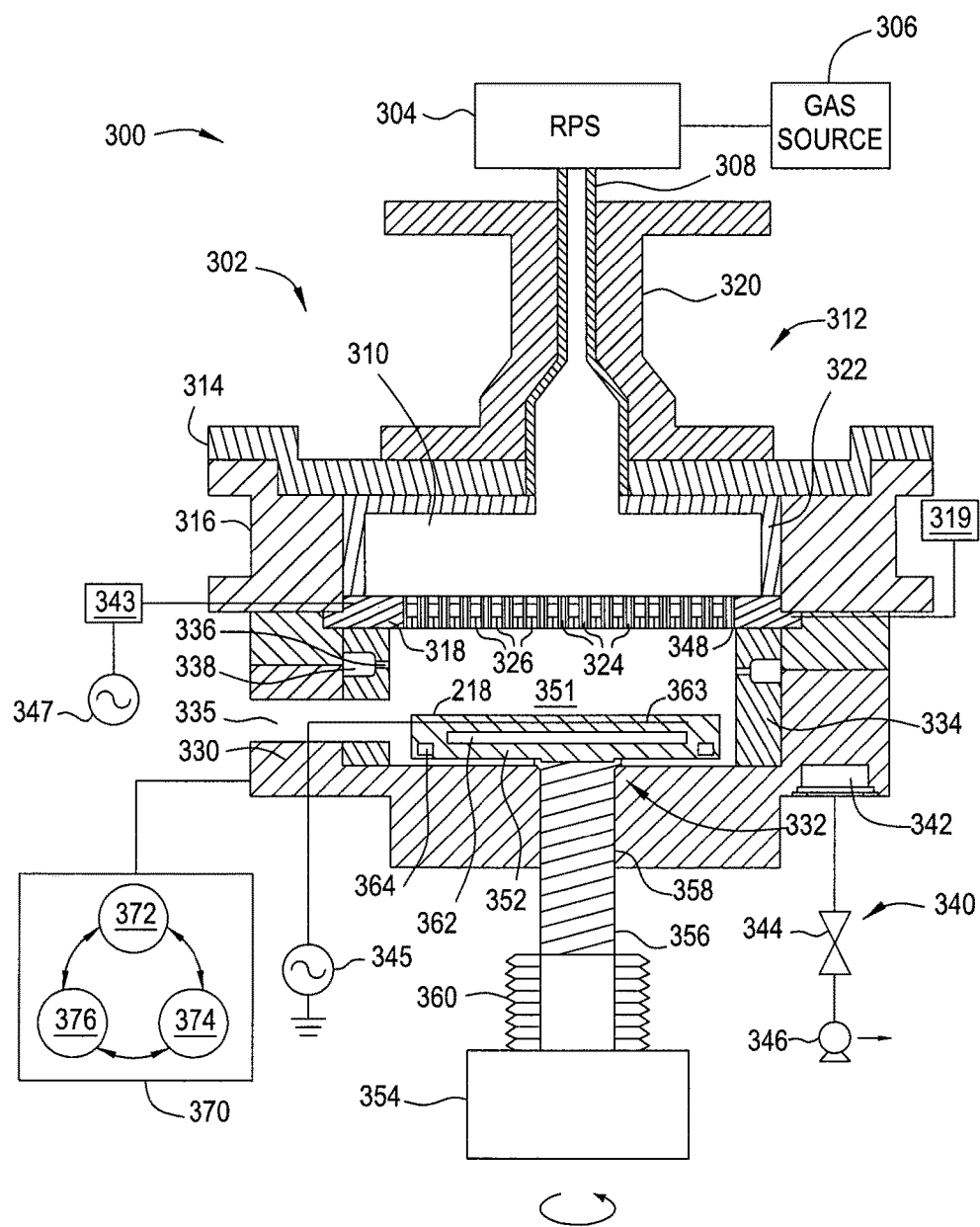
FIG. 3 depicts an apparatus configured to perform a structure reshaping process on a structure on a substrate.

FIG. 3 is a cross-sectional view of a processing chamber 300 for performing a structure reshaping process to reshape a structure formed on the fin structure of a FINFET device. Suitable processing chambers that may be adapted for use with the teachings disclosed herein include, for example, an HDP-PRODUCER® or C3® processing chamber available from Applied Materials, Inc. of Santa Clara, Calif. Although the processing chamber 300 is shown including a plurality of features that enable superior mask trimming and structure reshaping process. It is contemplated that other processing chambers may be adapted to benefit from one or more of the inventive features disclosed herein.

The processing chamber 300 includes a processing chamber body 302 and a remote plasma source 304 coupled to the processing chamber body 302. The remote plasma source 304 may be any suitable source that is capable of generating radicals. The remote plasma source 304 may be a remote plasma source, such as a radio frequency (RF) or very high radio frequency (VHRF) capacitively coupled plasma (CCP) source, an inductively coupled plasma (ICP) source, a microwave induced (MW) plasma source, an electron cyclotron resonance (ECR) chamber, or a high density plasma (HDP) chamber. The remote plasma source 304 may include one or more gas sources 306 and the remote plasma source 304 may be coupled to the processing chamber 300 by a radical conduit 308. One or more process gases, which may be radical-forming gases, may enter the remote plasma source 304 via the one or more gas sources 306. The one or more process gases may comprise an chlorine-containing gas, fluorine containing gas, inert gas, oxygen-containing gas, a nitrogen-containing gas, a hydrogen containing gas, or any combination thereof. Radicals generated in the remote plasma source 304 travel into the processing chamber 300 through the radical conduit 308 coupling to the processing chamber 300, reaching an interior processing region 351 defined in the processing chamber 300.

The radical conduit 308 is a part of a lid assembly 312, which also includes a radical cavity 310, a top plate 314, a lid rim 316, and a showerhead 318. The radical conduit 308 may comprise a material that is substantially nonreactive to radicals. For example, radical conduit 308 may comprise AlN, $SiO_2$, $Y_2O_3$, MgO, anodized $Al_2O_3$, sapphire, ceramics containing one or more of $Al_2O_3$, sapphire, AlN, $Y_2O_3$, MgO, or plastics. A representative example of a suitable $SiO_2$ material is quartz. The radical conduit 308 may be disposed within and supported by a radical conduit support member 320. The radical conduit support member 320 may be disposed on the top plate 314, which rests on the lid rim 316.

The radical cavity 310 is positioned below and coupled to the radical conduit 308, and the radicals generated in the remote plasma source 304 travel to the radical cavity 310 through the radical conduit 308. The radical cavity 310 is defined by the top plate 314, the lid rim 316 and the showerhead 318. Optionally, the radical cavity 310 may include a liner 322. The liner 322 may cover surfaces of the top plate 314 and the lid rim 316 that are exposed to the radical cavity 310. Radicals from the remote plasma source 304 pass through a plurality of tubes 324 disposed in the showerhead 318 to enter into an interior processing region 351. The showerhead 318 further includes a plurality of openings 326 that are smaller in diameter than the plurality of tubes 324. The plurality of openings 326 are connected to an internal volume (not shown) that is not in fluid communication with the plurality of tubes 324. One or more fluid sources 319 may be coupled to the showerhead 318 for introducing a fluid mixture into an interior processing region 351 of the processing chamber 300. The fluid mixture may include precursor, porogen, and/or carrier fluids. The fluid mixture may be a mixture of gases and liquids.

The processing chamber 300 may include the lid assembly 312, a chamber body 330 and a support assembly 332. The support assembly 332 may be at least partially disposed within the chamber body 330. The chamber body 330 may include a slit valve 335 to provide access to the interior of the processing chamber 300. The chamber body 330 may include a liner 334 that covers the interior surfaces of the chamber body 330. The liner 334 may include one or more apertures 336 and a pumping channel 338 formed therein that is in fluid communication with a vacuum system 340. The apertures 336 provide a flow path for gases into the pumping channel 338, which provides an egress for the gases within the processing chamber 300.

The vacuum system 340 may include a vacuum port 342, a valve 344 and a vacuum pump 346. The vacuum pump 346 is in fluid communication with the pumping channel 338 via the vacuum port 342. The apertures 336 allow the pumping channel 338 to be in fluid communication with the interior processing region 351 within the chamber body 330. The interior processing region 351 is defined by a lower surface 348 of the showerhead 318 and an upper surface 250 of the support assembly 332, and the interior processing region 351 is surrounded by the liner 334.

The support assembly 332 may include a support member 352 to support a substrate (not shown) for processing within the chamber body 330. The substrate may be any standard wafer size, such as, for example, 300 mm. Alternatively, the substrate may be larger than 300 mm, such as 450 mm or larger. The support member 352 may comprise aluminum nitride (AlN) or aluminum, depending on operating temperature. The support member 352 may be configured to chuck the substrate to the support member 352. For example, the support member 352 may be an electrostatic chuck or a vacuum chuck.

The support member 352 may be coupled to a lift mechanism 354 through a shaft 356 which extends through a centrally-located opening 358 formed in a bottom surface of the chamber body 330. The lift mechanism 354 may be flexibly sealed to the chamber body 330 by bellows 360 that prevents vacuum leakage from around the shaft 356. The lift mechanism 354 allows the support member 352 to be moved vertically within the chamber body 330 between a process position and a lower, transfer position. The transfer position is slightly below the opening of the slit valve 335. During operation, the spacing between the substrate and the showerhead 318 may be minimized in order to maximize radical flux at the substrate surface. For example, the spacing may be between about 100 mm and about 5,000 mm. The lift mechanism 354 may be capable of rotating the shaft 356, which in turn rotates the support member 352, causing the substrate disposed on the support member 352 to be rotated during operation.

One or more heating elements 362 and a cooling channel 364 may be embedded in the support member 352. The heating elements 362 and cooling channel 364 may be used to control the temperature of the substrate during operation. The heating elements 362 may be any suitable heating elements, such as one or more resistive heating elements. The heating elements 362 may be connected to one or more power sources (not shown). The heating elements 362 may be controlled individually to have independent heating and/or cooling control on multi-zone heating or cooling. With the ability to have independent control on multi-zone heating and cooling, the substrate temperature profile can be enhanced at any giving process conditions. A coolant may flow through the cooling channel 364 to cool the substrate. The support member 352 may further include gas passages extending to the upper surface 350 for flowing a cooling gas to the backside of the substrate.

A RF source power 343 may be coupled to the showerhead 318 through a RF source power matching box 347. The RF source power 343 may be low frequency, high frequency, or very high frequency. In one embodiment, the RF source power 343 is a high frequency RF generator that may generate high density plasma for deposit high density film layers. In one example, the RF source power 343 may serve as an inductively coupled RF energy transmitting device that can generate and control the inductive coupled plasma (ICP) generated in the interior processing region 351 above the support member 352. Dynamic impedance matching from the RF source power matching box 347 may be provided when generating the inductive coupled plasma (ICP).

In addition to the RF source power 343, a RF bias power source 345 may be coupled to the support member 352. The support member 352 is configured as a cathode and includes an electrode 363 that is coupled to the RF bias power source 345. The RF bias power source 345 is coupled between the electrode 363 disposed in the support member 352 and another electrode, such as the showerhead 318 or ceiling (top plate 314) of the chamber body 330. The RF bias power generated from the RF bias power source 345 excites and sustains a plasma discharge formed from the gases disposed in the interior processing region 351 of the chamber body 330.

In one mode of operation, the substrate 218 is disposed on the support member 352 in the processing chamber 300. A process gas and/or gas mixture is introduced into the chamber body 330 through the showerhead 318 from the gas sources 306. The vacuum pump 346 maintains the pressure inside the chamber body 330 while removing deposition by-products.

A controller 370 is coupled to the processing chamber 300 to control operation of the processing chamber 300. The controller 370 includes a central processing unit (CPU) 372, a memory 374, and a support circuit 376 utilized to control the process sequence and regulate the gas flows from the gas sources 306. The CPU 372 may be any form of general purpose computer processor that may be used in an industrial setting. The software routines can be stored in the memory 374, such as random access memory, read only memory, floppy, or hard disk drive, or other form of digital storage. The support circuit 376 is conventionally coupled to the CPU 372 and may include cache, clock circuits, input/output systems, power supplies, and the like. Bi-directional communications between the controller 370 and the various components of the processing chamber 300 are handled through numerous signal cables.

Figure 4:
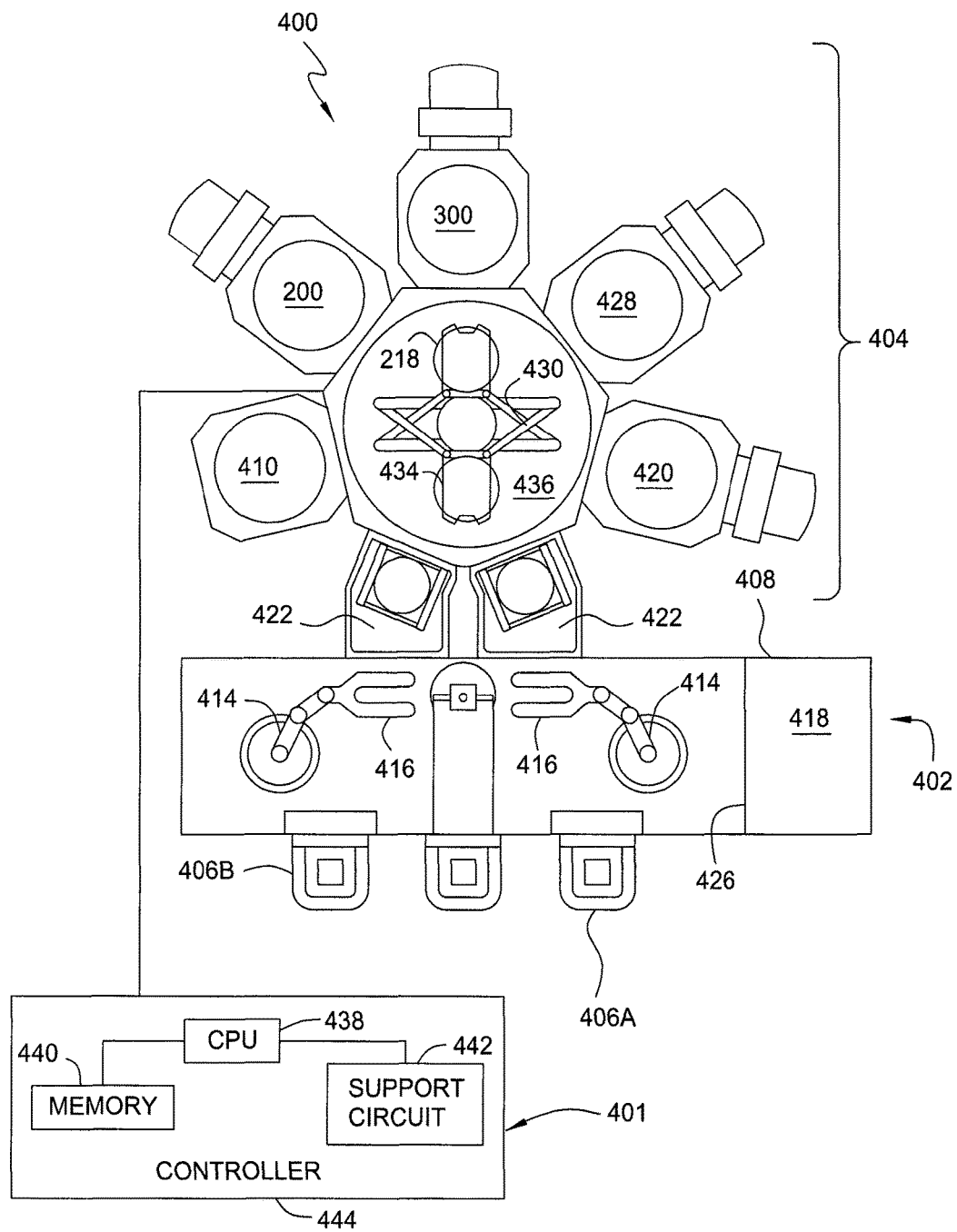
FIG. 4 depicts a cluster system configured to incorporate the apparatus depicted in FIGS. 2 and 3.

FIG. 4 is a schematic, top plan view of an exemplary processing system 400 that includes one or more of the processing chambers 200, 300 illustrated in FIGS. 2-3 that are incorporated and integrated therein. In one embodiment, the processing system 400 may be a CENTURA® integrated processing system, commercially available from Applied Materials, Inc., located in Santa Clara, Calif. It is contemplated that other processing systems (including those from other manufacturers) may be adapted to benefit from the disclosure.

The system 400 includes a vacuum-tight processing platform 404, a factory interface 402, and a system controller 444. The processing platform 404 includes at least one processing chamber 200, 300 such as the one of the processing chambers 200, 300 depicted from FIGS. 2-3, a plurality of processing chambers 410, 428, 420 and at least one load-lock chamber 422 that is coupled to a vacuum substrate transfer chamber 436. Two load lock chambers 422 are shown in FIG. 4. The factory interface 402 is coupled to the transfer chamber 436 by the load lock chambers 422.

In one embodiment, the factory interface 402 comprises at least one docking station 408 and at least one factory interface robot 414 to facilitate transfer of substrates. The docking station 408 is configured to accept one or more front opening unified pod (FOUP). Two FOUPS 406A-B are shown in the embodiment of FIG. 4. The factory interface robot 414 having a blade 416 disposed on one end of the robot 414 is configured to transfer the substrate from the factory interface 402 to the processing platform 404 for processing through the load lock chambers 422. Optionally, one or more processing chambers 200, 300, 428, 420, 410 may be connected to a terminal 426 of the factory interface 402 to facilitate processing of the substrate from the FOUPS 406A-B.

Each of the load lock chambers 422 have a first port coupled to the factory interface 402 and a second port coupled to the transfer chamber 436. The load lock chambers 422 are coupled to a pressure control system (not shown) which pumps down and vents the load lock chambers 422 to facilitate passing the substrate between the vacuum environment of the transfer chamber 436 and the substantially ambient (e.g., atmospheric) environment of the factory interface 402.

The transfer chamber 436 has a vacuum robot 430 disposed therein. The vacuum robot 430 has a blade 434 capable of transferring substrates 218 among the load lock chambers 422, the deposition chamber 200, processing chamber 300, and the processing chambers 428, 410, 420.

In one embodiment of the system 400, the system 400 may include an epitaxial deposition chamber 200 depicted in FIG. 2, a processing chamber 300 depicted in FIG. 3 (such as a structure reshaping chamber or a high density plasma (HDP) chamber) and other processing chambers 428, 420, 410, which may be a deposition chamber, etch chamber, thermal processing chamber (e.g., RTP chamber, laser anneal chamber) or other similar type of semiconductor processing chamber that may assist forming and reshaping fin structures in FINFET devices.

The system controller 444 is coupled to the processing system 400. The system controller 444, which may include the computing device 401 or be included within the computing device 401, controls the operation of the processing system 400 using a direct control of the processing chambers 200, 300, 410, 428, 420 of the system 400. Alternatively, the system controller 444 may control the computers (or controllers) associated with the processing chambers 200, 300, 410, 428, 420 and the system 400. In operation, the system controller 444 also enables data collection and feedback from the respective chambers and the processing chambers 200, 300 to optimize performance of the system 400.

The system controller 444, much like the computing device 401 described above, generally includes a central processing unit (CPU) 438, a memory 440, and support circuit 442. The CPU 438 may be one of any form of a general purpose computer processor that can be used in an industrial setting. The support circuits 442 are conventionally coupled to the CPU 438 and may comprise cache, clock circuits, input/output subsystems, power supplies, and the like. The software routines transform the CPU 438 into a specific purpose computer (controller) 444. The software routines may also be stored and/or executed by a second controller (not shown) that is located remotely from the system 400.

Figure 5:
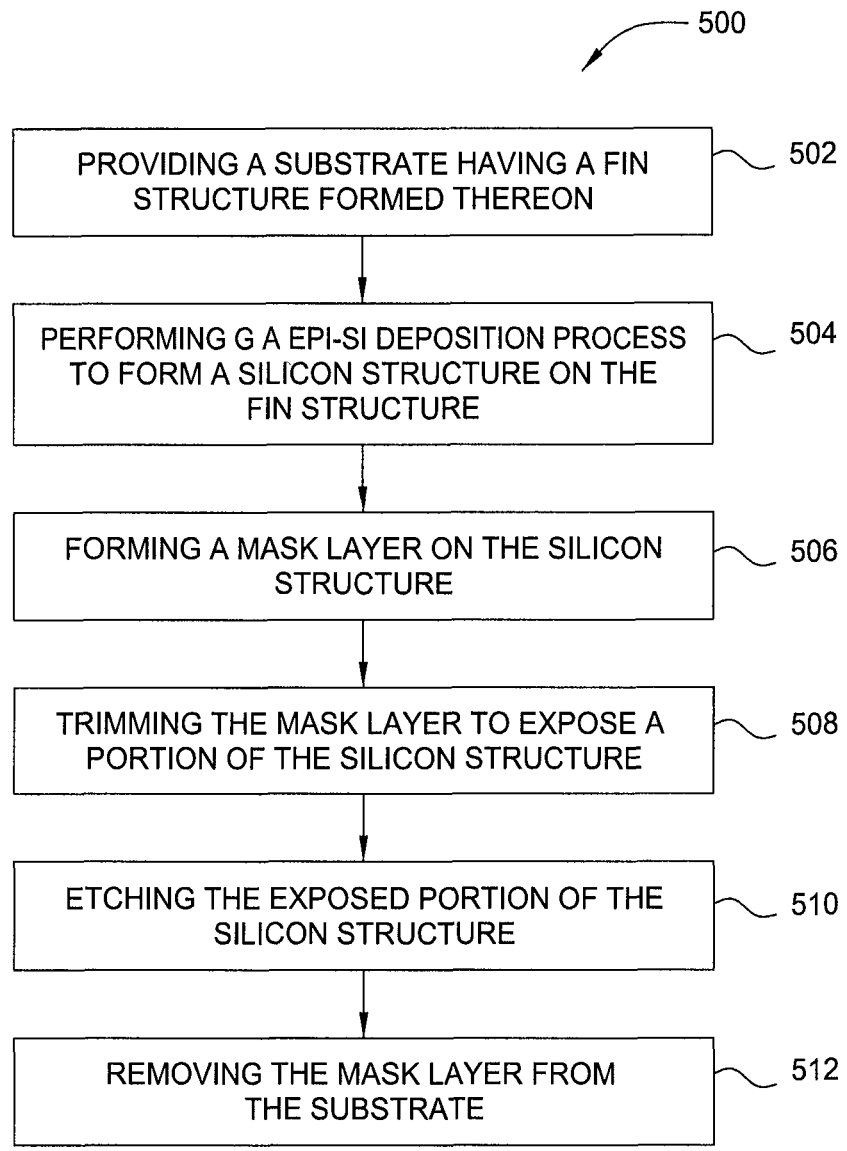
FIG. 5 depicts a flow diagram of a method for forming FINFET devices on a substrate with desired profiles.

FIG. 5 is a flow diagram of one implementation of a structure reshaping method 500 utilized to reshape a structure. The structure may be a three dimensional protrusion structure extending outward from the substrate, such as a fin structure, a gate structure, a contact structure, or any other suitable structures utilized in semiconductor applications. FIGS. 6A-6F are schematic cross-sectional views of a portion of a composite substrate 218 corresponding to various stages of the method 500. The method 500 may be utilized to form a shaped structure, such as a diamond like structure, formed on the fin structures on a substrate having desired materials formed on different regions of the fin structure which may later be utilized to form a fin field effect transistor (FinFET) for three dimensional (3D) stacking of semiconductor devices. Alternatively, the method 500 may be beneficially utilized to form other types of structures.

The method 500 begins at operation 502 by providing a substrate, such as the substrate 218 depicted in FIG. 6A. The substrate 218 may have a plurality of structures 606, such as fin structures 604, formed thereon, as shown in FIG. 6A. In one embodiment, the substrate 218 may be made of a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 218 may have various dimensions, such as 200 mm, 300 mm, 450 mm or other diameter, as well as, being a rectangular or square panel. Unless otherwise noted, embodiments and examples described herein are conducted on substrates with a 200 mm diameter, a 300 mm diameter, or a 450 mm diameter substrate. In the embodiment wherein a SOI structure is utilized for the substrate 218, the substrate 218 may include a buried dielectric layer disposed on a silicon crystalline substrate. In the embodiment depicted herein, the substrate 218 may be a crystalline silicon substrate. Moreover, the substrate 218 is not limited to any particular size or shape. The substrate 218 may be a round substrate having a 200 mm diameter, a 300 mm diameter or other diameters, such as 450 mm, among others. The substrate 218 may also be any polygonal, square, rectangular, curved or otherwise non-circular workpiece, such as a polygonal glass substrate used in the fabrication of flat panel displays.

The fin structures 604 may be a structure extending outward and protruding from the substrate 218. The fin structure 604 may have an upper portion 609 connected to a lower portion 605. In one embodiment, the fin structures 604 may be formed in the substrate 218 by etching the substrate 218 to form recess structures between each of the fin structures 604. A portion of the recess structures are then filled with insulating materials to form shallow trench isolation (STI) structures 602 so as to facilitate forming the fin structures 604 therebetween for the fin field effect transistors (FinFET) manufacture process. In one embodiment, the upper portion 609 may protrude from the shallow trench isolation (STI) structures 602. It is noted that each of the fin structure 604 protruding from the shallow trench isolation (STI) structures 602 may or may not be exactly the same, due to manufacturing deviations, microloading effect, or other issues.

As the fin structure 604 is formed by etching the substrate 218, thus, the fin structure 604 may be of the same material as the substrate 218, which may be a silicon containing material. In the embodiment depicted herein, the substrate 218 is a silicon substrate so that the fin structure 604 formed therefrom is also a silicon material, such as a crystalline silicon material.

In one embodiment, the insulating material utilized to form the shallow trench isolation (STI) structures 602 may be a dielectric material, such as silicon oxide material. The insulating material may be formed by a plasma enhanced chemical vapor deposition (CVD), a flowable chemical vapor deposition (CVD), a high density plasma (HDP) chemical vapor deposition (CVD) process, atomic layer deposition (ALD), cyclical layer deposition (CLD), physical vapor deposition (PVD), or the like as needed. In one embodiment, the insulating material is formed by a flowable or plasma enhanced chemical vapor deposition (CVD).

At operation 504, a deposition process is performed to form a shaped structure, such as a diamond like structure 608, on the fin structure 604. It is noted that the shaped structure formed on the fin structure 604 could be in different forms, such as rectangular or square or in any forms, based on different growth rates from different growth surfaces. The deposition process utilized herein is an epitaxial growth process that may be performed in the epitaxial deposition chamber 200 as depicted in FIG. 2. The epitaxial growth process may form a diamond like structure 608 on the fin structure 604, as shown in FIG. 6B. The epitaxial growth process performed at operation 504 may provide a selective deposition process to form silicon materials predominately atop the fin structure 604, which is also a silicon material.

Figure 1A:
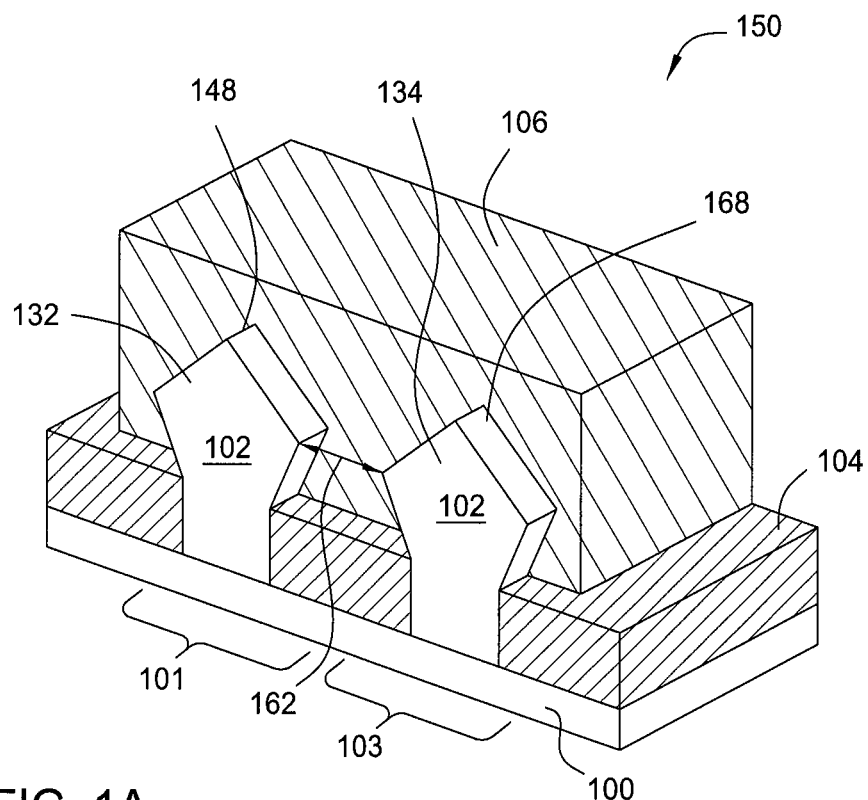
FIG. 1A depicts a schematic perspective view of a substrate having a fin field effect transistor (FinFET) structure formed thereon in a conventional manner.
Figure 1B:
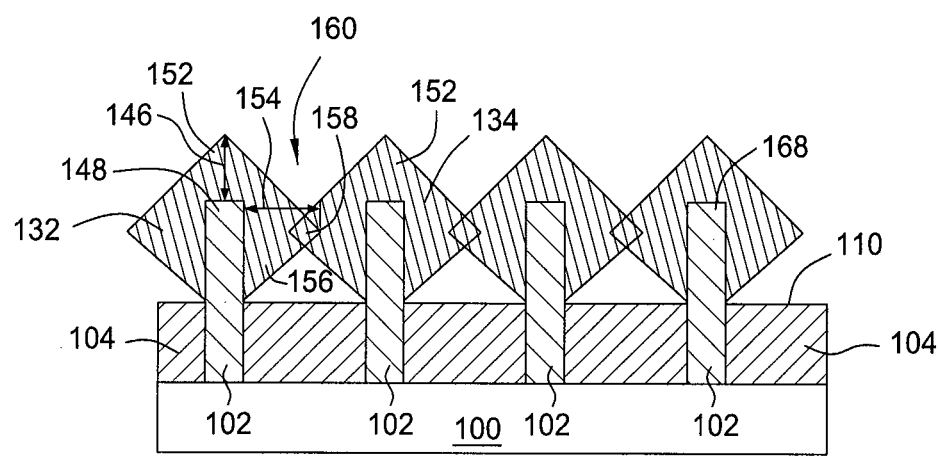
FIG. 1B depicts a cross sectional view of a substrate having a portion of the fin field effect transistor (FinFET) structure formed thereon in a conventional manner.

The epitaxial growth of the silicon naturally grows onto silicon materials, such as the fin structure 604, on the substrate 218, forming into a shaped structure, such as the diamond like structure 608 on the fin structure 604, as shown in FIG. 6B. As the natural shape of the diamond like structure 608 is controlled by the crystallographic orientation of the silicon material in <111> plane, which normally has the slowest epitaxial growth rate. Thus, the growth rates of the diamond like structure 608 are often different on different surfaces of the diamond like structure 608, such as different growth rates found from a horizontal surface 612 (e.g., a top surface) or from a vertical surface 614 (e.g., a sidewall surface) of the fin structure 604. The vertical sidewall surface 614 of the fin structure 604 normally has a <110> crystallographic orientation while the horizontal top surface 612 of the fin structure 604 normally has a <100> crystallographic orientation. The diamond like structure 608 formed on the fin structure 604 has a top facet 613 with <001> crystallographic orientation while with a top side surface 611 having a <111> crystallographic orientation, which has the slowest growth rate. The side top surface 611 and a side low surface 617 defining a side portion 616 of the diamond like structure 608 with a tip 632. While different growth rates are often occurred at different surfaces with different crystallographic orientations, the resultant shape of the diamond like structure 608 often have the side portion 616 wider than a top portion 618 when the deposition process proceeds too long, resulting in an overlapping structure at the side portion of the diamond like structure, as described above with reference to FIG. 1B in the conventional devices. Thus, the deposition process at operation 504 is terminated prior to the side portion 616 of the diamond like structure 608 overlapped with the neighboring diamond like structures 608 from the tip 632, leaving a space 622 between the tips 632 of the diamond like structure 608. In one embodiment, the epitaxial growth process performed at operation 504 is about 20 seconds and about 80 seconds to form the diamond like structure 608 having a first lateral width 615 between about 10 nm and about 40 nm in the side portion 616. It is noted that the first lateral width 615 as described here is straight distance defined between the tip 632 and the side surface 614 of the fin structure 604.

In one embodiment, the gas mixture utilized to perform the epitaxial growth process includes a silicon containing gas. Suitable examples of silicon containing gas include $SiH_4$, dichlorosilane (DCS) gas, trichlorosilane (TCS), or other suitable silicon containing gas. In one exemplary embodiment, the gas mixture supplied to the processing chamber 100 includes dichlorosilane (DCS) gas or silane gas ($SiH_4$). The dichlorosilane (DCS) gas or silane gas ($SiH_4$) may be supplied at a flow rate between about 0.1 slm and about 1 slm. The diamond like structure 608 formed on the fin structure 604 is a crystalline silicon material, a doped silicon containing layer or a doped silicon layer. The substrate temperature may be controlled at between about 600 degrees Ceils and about 800 degrees Celsius. The pressure during the process is controlled at between about 100 Torr and about 400 Torr.

At operation 506, after the epitaxial growth process at operation 504 is completed, the substrate 218 may be then transferred to a high density plasma processing chamber, such as the HDP processing chamber 300 depicted in FIG. 3, to perform a mask layer deposition process. The mask layer deposition process performed on the substrate 218 forms a mask layer 620 on the diamond like structure 608, as shown in FIG. 6C. The mask layer 620 substantially forms on the side top surface 611 of the diamond like structure 608, covering substantially the side top portion 618 of the diamond like structure 608 from the tip 632. A portion of the redundant mask layer 620 may be fallen in the space 622 defined between the tips 632 of the diamond like structure 608. The mask layer 620 is formed on the diamond like structure 608 following the topography defined by the top facet 613 and the two side top surfaces 611 of the diamond like structure 608, also forming as a top diamond like shape of the mask layer 620. The top diamond like shape of the mask layer 620 has a first width 624 between about 70 nm and about 180 nm. The first width 624 described here in the mask layer 620 is defined by a largest straight distance between two opposing sides 621 of the mask layer 620.

In one embodiment, the mask layer 620 formed on the diamond like structure 608 is a material having a high etching selectivity to the underlying silicon material from the diamond like structure 608 to facilitate selectivity during the etching process performed subsequently discussed below. In one example, the mask layer 620 is a carbon containing material, such as amorphous carbon (a-C), silicon carbide (SiC), silicon oxycarbide (SiOCN), silicon carbide nitride (SiCN), and the like. In one particular example, the diamond like structure 608 is fabricated from amorphous carbon.

During deposition of the mask layer 620, a mask layer deposition gas mixture may be supplied into the processing chamber 300 for processing. The gas mixture includes at least a hydrocarbon compound and an inert gas. In one embodiment, the hydrocarbon compound has a formula $C_xH_y$, where x has a range between 1 and 12 and y has a range of between 4 and 26. More specifically, the hydrocarbon compound may include, for example, alkanes such as methane, ethane, propane, butane, pentane, hexane, heptane, octane, nonane, decane and the like; alkenes such as propene, ethylene, propylene, butylene, pentene, and the like; dienes such as hexadiene butadiene, isoprene, pentadiene and the like; alkynes such as acetylene, vinylacetylene and the like. In an exemplary embodiment, the hydrocarbon compounds are propene, acetylene, ethylene, propylene, butylenes, toluene, alpha-terpinene. In a particular embodiment, the hydrocarbon compound is methane, propene ($C_3H_6$) or acetylene.

Alternatively, one or more hydrocarbon compounds may be mixed with the hydrocarbon compound in the gas mixture supplied to the process chamber. A mixture of two or more hydrocarbon compounds may be used to deposit the amorphous carbon material as needed.

The inert gas, such as argon (Ar) or helium (He), is supplied with the mask layer deposition gas mixture into the process chamber 300. It is noted that the inert gas supplied in the mask layer deposition gas mixture may have a relatively high ratio, relative to the hydrocarbon compound. The high ratio of the inert gas supplied in the mask layer deposition gas mixture will help increase the sputtering rate at a vertical direction and minimize the growth rate at the lateral direction to avoid early merger of the two adjacent mask layer 620 formed on the adjacent diamond like structures 608. In one embodiment, an inert gas, such as argon (Ar) or helium (He) gas, is supplied with the hydrocarbon compound, such as propene ($C_3H_6$) or acetylene, into the process chamber to deposit the amorphous carbon layer to form the mask layer 620. In one example, the mask layer deposition gas mixture has a ratio of hydrocarbon compound to inert gas of between about 1:1 and about 1:5.

During deposition, the substrate temperature may be controlled between about 25 degrees Celsius and about 55 degrees Celsius. The hydrocarbon compound, such as propene ($C_3H_6$), may be supplied in the gas mixture at a rate between about 200 sccm and about 3000 sccm, such as between about 400 sccm and about 2000 sccm. The inert gas, such as Ar gas, may be supplied in the gas mixture at a rate between about 200 sccm and about 10000 sccm, such as about 1200 sccm and about 8000 sccm. A RF source power of between about 400 Watts to about 2000 Watts, such as 450 Watts to about 1000 Watts may be applied to maintain a plasma formed from the gas mixture. The process pressure may be maintained at about 5 mTorr to about 50 mTorr, such as about 10 mTorr and about 30 mTorr, for example, about 15 mTorr to about 25 mTorr. The spacing between the substrate and showerhead may be controlled at about 200 mils to about 6000 mils.

During the deposition process at operation 506, a back side cooling mechanism, such as fluid or helium gas, may be turned on to maintain the deposition process at a desired range, such as a desired relatively low temperature between about 25 degrees Celsius and about 55 degrees Celsius. The back side cooling mechanism may be turned on by providing a fluid medium in the cooling channel, such as the cooling channel 364 embedded in the support member 352, as depicted in FIG. 3. The proper temperature range control may be achieved by a controlled balance between the thermal energy provided by the heating element 362 and the cooling medium provided from the cooling channel 364. Furthermore, the thermal energy provided from the plasma may also impact on the substrate temperature. Thus, maintaining the support member 352 at a desired relatively low temperature, such as between about 35 degrees Celsius and about 45 degrees Celsius, is believed to provide a desired film property of the mask layer 620 with desired density and deposition rate.

It is believed that the relatively low temperature during the mask layer deposition process may assist gentle deposition process performed on the diamond like structure 608, compared to the conventional aggressive RF bias power directional process. Thus, by utilizing minimum RF bias power or substantially no RF bias power during the deposition process, aggressive ion bombardment process may be eliminated to avoid too much loss of STI structures 602 and minimize the faceting of the top portion of the mask layer 620.

Figure 6D:
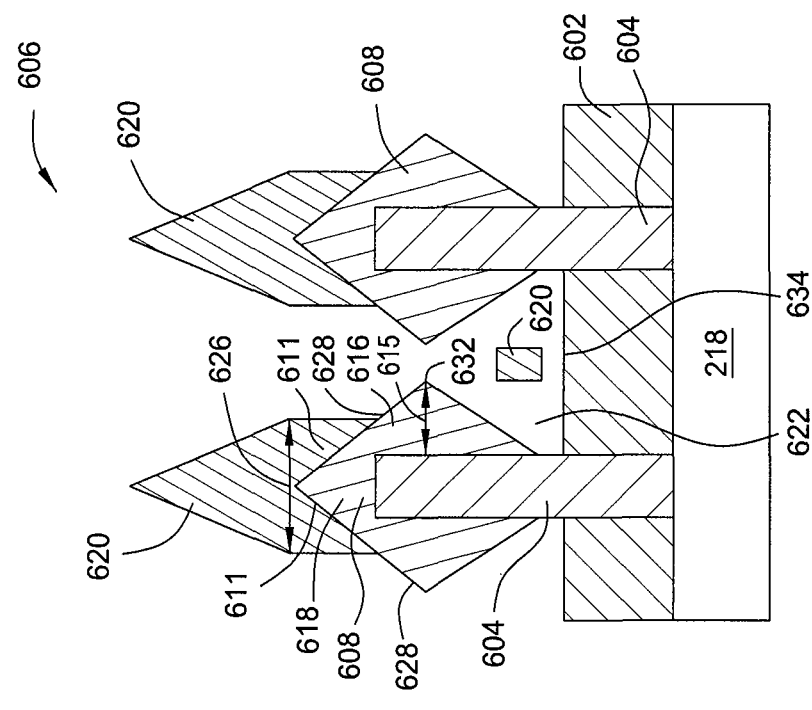
Figure 6C:
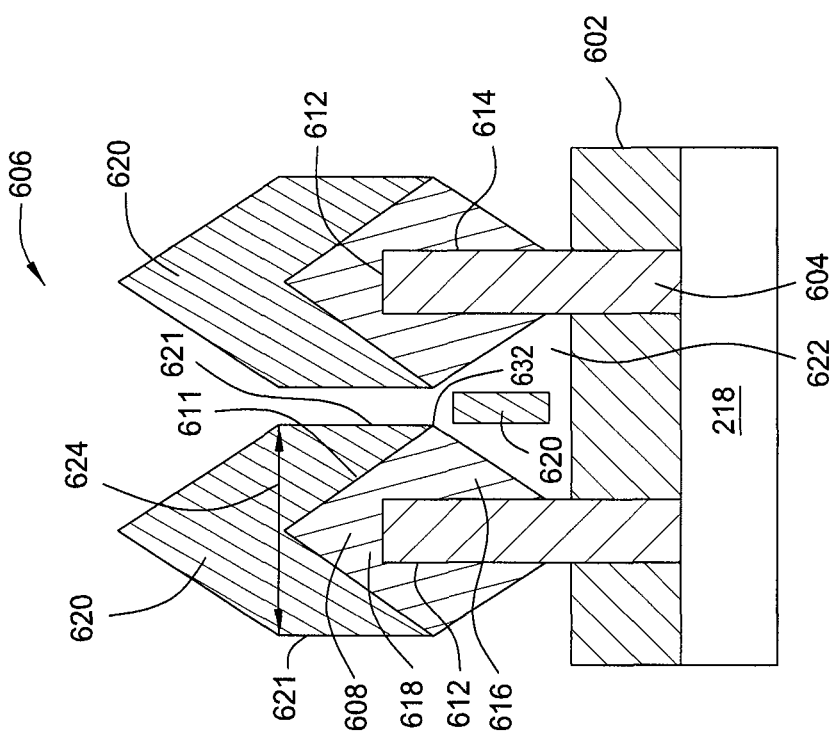

At operation 508, after the mask layer 620 is formed on the substrate 218, a mask layer trimming process may be performed to trim the mask layer 620 to a desired dimension, as shown in FIG. 6D. The mask layer trimming process may be performed in the same processing chamber where the mask layer deposition process is performed, such as the HDP processing chamber 300 depicted in FIG. 3. By doing so, the mask layer deposition process and the mask layer trimming process may be performed in one single chamber without breaking vacuum (e.g., reducing the likelihood of contamination from the environment) or transferring out from a processing chamber, thus reducing manufacturing processing cycle time and increasing process throughput.

In one example, the mask layer trimming process is performed to trim the mask layer 620 from the first width 624, as shown in FIG. 6C, to a second width 626, which is between about 20 percent and about 50 percent, such as about 30 percent, width short, from the substrate 218, as shown in FIG. 6D. The trimmed mask layer 620 exposes a lower portion 628 of the diamond like structure 608 from the top side surface 611. The trimming process is performed to expose the lower portion 628 from the top side surface 611, leaving the side portion 616 of the diamond like structure 608 exposed for etching. As discussed earlier, due to the different growth rates on different surfaces, the shaped structure 608 formed on the fin structure 604 tends to have a diamond shape having the side portion 616 with the relatively longer first lateral width 615 that may be easily overlapped with the adjacent the side portion 616 of the diamond like structure 608 from the tips 632. Thus, by trimming the mask layer 620 to expose a portion of the side portion 616 of the diamond like structure 608, the side portion 616 may be etched utilizing the trimmed mask layer 620 as a mask, thus reducing the dimension of the side portion 616 without loss of the top portion 618, preventing undesired overlapping (e.g., merger) of the diamond like structure 608 from the tips 632. During the trimming process, the size of the redundant mask layer 620 formed in the space 622 between the fin structures 604 may also be proportionally trimmed and reduced.

During the trimming process at operation 508, a trimming gas mixture may be supplied in the processing chamber 300 to trim the mask layer 620 until a desired dimension, such as the reduced second width 626 of the mask layer 620 is obtained. The trimming process is generally an isotropic trimming process. During trimming, the mask layer 620 is trimmed isotopically before the trimmed mask layer 620 is utilized as the etch mask for the subsequent etching process at operation 510. In one embodiment, the trimming process slows down the deposition process (e.g., a leftover process from the operation 506) at the vertical direction while trims the mask layer 620 at a lateral direction from the first width 624, e.g., about 170 nm, to the second width 626 of about 115 nm or less. The trimming gas mixture is selected to have a high selectivity for the mask layer 620 over the diamond like structure 608, thus predominantly trimming the mask layer 620 rather than etching or damaging the exposed lower portion 628 of the diamond like structure 608. In one embodiment, the trimming gas mixture includes, but not limited to, a hydrogen containing gas accompanying with an optional inert gas. Examples of the hydrogen containing gas include $H_2$, $H_2O$, $CH_4$ and the like. Alternatively, inert gas, such as Ar or He, may also be supplied in the trimming gas into the processing chamber 300.

During the trimming process at operation 508, the back side cooling mechanism may be turned off to maintain a relatively high substrate temperature, e.g., higher than the substrate temperature controlled at operation 506 for forming the mask layer 620. It is believed that the relatively high temperature during the trimming process may assist the hydrogen species from the trimming gas mixture to gently react with the silicon elements from the diamond like structure 608, compared to the conventional aggressive RF bias power trimming process, assisting trimming the mask layer 620 in a lateral direction without attacking the top portion of the mask layer 620. Thus, by controlling the substrate temperature at a desired range between the deposition process at operation 506 and the trimming process at operation 508, along with the different gas mixtures (e.g., a deposition gas mixture or a trimming gas mixture) supplied, the trimming and/or the deposition behaviors in these two operations may be controlled without using the aggressive directional RF bias power as practiced conventionally.

In one example, the back side cooling mechanism is turned off during the trimming process at operation 508 to allow the substrate temperature going up (e.g., ramping up) during the trimming process. The back side cooling mechanism may be turned off by terminating supplying the fluid medium in the cooling channel 364 embedded in the support member 352. As the substrate temperature escalates, the deposition behavior is inhibited while the trimming behavior is encouraged, thus enhancing the trimming process to trim the mask layer 620 in lateral directions. In one embodiment, averagely, the substrate temperature controlled during the trimming process at operation 508 is controlled at between about 400 percent and about 600 percent higher than the substrate temperature during the deposition process at operation 506. In one example, the substrate temperature is controlled at between about 150 degrees Celsius and about 250 degrees Celsius during the trimming process at operation 508.

Several process parameters are regulated while the trimming gas mixture at operation 508 supplied into the processing chamber 300. In one embodiment, the chamber pressure in the presence of the trimming gas mixture is regulated to between about 30 mTorr to about 200 mTorr, for example, such as between about 33 mTorr and about 80 mTorr. The trimming gas mixture may include hydrogen containing gas flowed into the chamber at a rate between about 10 sccm to about 1000 sccm. A RF source power may be applied to maintain a plasma formed from the trimming process gas. For example, a source power of about 500 Watts to about 5000 Watts, such as about 2500 Watts, may be applied to an inductively coupled antenna source to maintain a plasma inside the etch chamber. The inductively coupled plasma (ICP) may quickly generates plasma from the trimming gas mixture with high density, without utilizing a RF bias power or with minimum RF bias power, to efficiently and quickly trim the mask layer 620 to the desired dimension without overly damaging other portion of the substrate 218, including the top portion of the mask layer 620 and the exposed lower portion 628 of the diamond like structure 608.

Figure 6E:
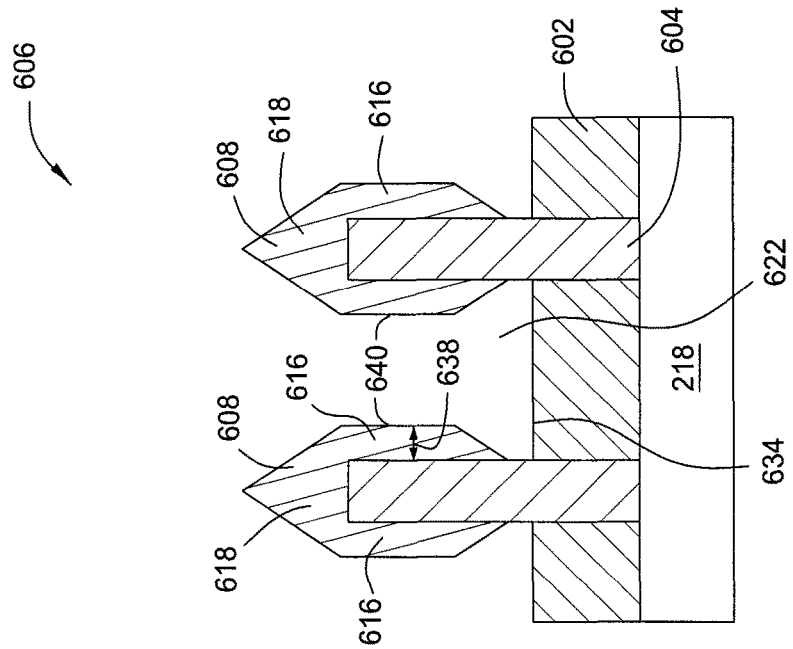

At operation 510, after the mask layer 620 is trimmed to the predetermined dimension, an etching process (or called a structure reshaping process) is then performed to etch the diamond like structure 608 from the exposed lower portion 628, as depicted in FIG. 6E. The etching process is also performed in the same processing chamber where the deposition process at operation 506 and the trimming process at operation 508 are performed, such as the processing chamber 300 depicted in FIG. 3. The etching process performed at operation 510 removes some of the side portion 616 of the diamond like structure 608, reducing the dimension of the side portion 616 from the first lateral width 615 to a second lateral width 638. The etching process is continuously performed until the exposed lower portion 628 unshielded by the mask layer 620 is removed from the substrate 218. The second lateral width 638 is averagely between about 20 percent and about 50 percent shorter than the first lateral width 615. In one example, the first lateral width 615 is between about 20 nm and about 50 nm while the second lateral width 638 is between about 10 nm and about 25 nm.

The etching process performed at operation 510 is also considered a main process of the structure reshaping process to reshape the outer contour of the diamond like structure 608, so as to prevent merger or overlapping of the diamond like structure 608 from the tip 632 of the side top portion 618.

The etching gas mixture is supplied into a processing chamber 300 includes at least a halogen containing gas. As the diamond like structure 608 is fabricated from silicon materials, the halogen containing gas selected to etch the diamond like structure 608 may enable a chemical reaction between the halogen containing gas and the silicon material.

Suitable examples of the halogen containing gas include HBr, $Cl_2$, $SF_6$ and the like. In one particular example, the halogen containing gas is HBr.

In one example, the back side cooling mechanism is turned on during the etching process at operation 510 to allow the substrate temperature going down (e.g., ramping down) during the etching process. The back side cooling mechanism may be turned on by supplying the fluid medium in the cooling channel 364 embedded in the support member 352. As the substrate temperature drops, the etching behavior from the halogen species supplied in the etching gas mixture is encouraged and occurred in a predictable and desired manner, thus enhancing the etching process to etch the diamond like structure 608 in a desired manner. In one embodiment, averagely, the substrate temperature controlled during the etching process at operation 510 is controlled at between about 60 percent and about 80 percent lower than the substrate temperature during the trimming process at operation 508, but substantially similar to the substrate temperature regulated during the deposition process at operation 506. In one example, the substrate temperature is controlled at between about 25 degrees Celsius and about 35 degrees Celsius during the etching process at operation 510.

While supplying the etching gas mixture, an inert gas may also be supplied into the etching gas mixture to assist the profile control as needed. Examples of the inert gas supplied in the gas mixture include Ar, He, Ne, Kr, Xe or the like. In one embodiment, the halogen containing gas supplied in the etching gas mixture may be maintained at a flow rate by volume between about 30 sccm and about 150 sccm. The optional inert gas may be supplied to the processing chamber at a flow rate by volume between about 50 sccm and about 300 sccm.

After the etching gas mixture is supplied to the processing chamber mixture, an inductively coupled RF power may be supplied in the etching gas mixture for between about 200 Watts and about 3000 Watts. For example, a source power of about 200 Watts to about 3000 Watts, such as about 2500 Watts, may be applied to an inductively coupled antenna source to maintain a plasma inside the etch chamber. The inductively coupled plasma (ICP) may quickly generates plasma from the etching gas mixture with high density, without utilizing a RF bias power or with minimum RF bias power, to efficiently and quickly etch the diamond like structure 608 to the desired second lateral width 638 without overly damaging the top mask layer 620.

Several process parameters may also be controlled while supplying the etching gas mixture to perform the etching process at operation 510. The pressure of the processing chamber may be controlled at between about 0.5 milliTorr and about 500 milliTorr, such as between about 2 milliTorr and about 10 milliTorr.

Figure 6F:
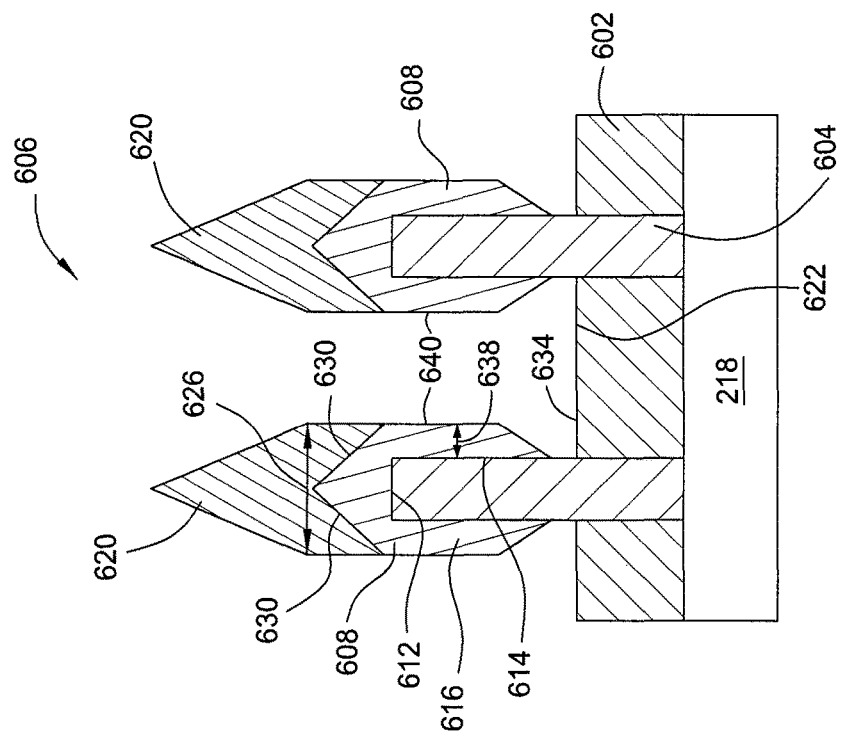

At operation 512, after the side portion 616 of the diamond like structure 608 is etched to a desired dimension and profile, the remaining mask layer 620 is then removed from the substrate 218, as shown in FIG. 6F. The remaining mask layer 620 on the substrate 218 may be removed by performing an ashing/stripping process also in the processing chamber 300, the same chamber where the deposition process, trimming process and the etching process at operations 506, 508, 510 are performed. By doing so, the operations 506, 508, 510, 512 may be integrated to perform in one single chamber, also together called as a structure reshaping process, without removing the substrate 218 to the atmosphere, thus reducing process cycle time, increasing process throughput and reducing the likelihood of contamination during substrate transfer.

While removing the remaining mask layer 620 from the substrate 218, etching by-products and/or other surface contaminants may also be removed. In one example, the ash process may be performed by supplying a gas mixture, such as an ash gas mixture, into the processing chamber, such as the processing chamber 300 depicted in FIG. 3. The ash process may be an isotropic etching process to remove the remaining mask layer 620 and other related by-products contaminants from the substrate 218.

In one example, the ashing gas mixture including at least one oxygen containing gas and/or a hydrogen containing gas and optionally an inert gas into the processing chamber to react with the carbon elements from the mask layer 620 remained on the substrate 218. The oxygen containing gas and/or the hydrogen containing gas and/or an inert gas supplied from the ashing gas mixture forms carbon oxide gas or carbon hydrogen gas or other carbon containing byproducts in gas phase to be pumped out of the chamber. In one example, the oxygen containing gas supplied in the ash gas mixture includes $O_2$ and the hydrogen containing gas supplied in the ash gas mixture include $H_2$ the inert gas supplied in the ash gas mixture includes He, Ar, and the like.

During the ash process, several process parameters may be regulated to control the ash process. Similarly, during the ashing process, the back side cooling mechanism may be turned on to maintain a low substrate temperature regime to assist removing the mask layer 620 from the substrate. As described above, the low substrate temperature during processing may assist trimming/removing the carbon containing mask layer 620 from the substrate 218. Thus, the process parameters controlled at the ashing process at operation 512 may be similarly configured as the process parameters of the etching process performed at operation 510.

Thus, methods for forming structures with desired profile and dimensions for three dimensional (3D) stacking of fin field effect transistor (FinFET) for semiconductor chips are provided. The methods utilize an all-in-one cluster system that includes an epitaxial deposition chamber and a high density plasma chamber that enables formation of a shaped structure on a fin structure as well as reshaping of the shaped structure all integrated in the cluster system. By a well-controlled substrate temperature between a relatively high substrate temperature regime and a relative low temperature regime, the shaped structure formed on the fin structure may be efficiently reshaped to a desired dimension and profile, thus forming channel or gate structures for FINFET devices as needed. As such, a fin structure with desired profile for gate channel structure is then obtained.

While the foregoing is directed to embodiments of the present invention, other and further embodiments of the invention may be devised without departing from the basic scope thereof, and the scope thereof is determined by the claims that follow.

The invention claimed is:

1. A method for forming a structure on a substrate, the method comprising:
    performing an epitaxial deposition process to form a shaped structure on a fin structure having a first width, the shaped structure comprising a first side portion adjacent to the fin structure and having a second width greater than the first width, and comprising a second side portion adjacent to the first side portion and having a third width greater than the second width, the shaped structure disposed on a substrate, wherein a shaped surface is formed covering a top surface of the fin structure;

performing a mask layer deposition process to form a mask layer having the third width on and covering a first side portion and the second side portion of the shaped structure at a first temperature in a processing chamber;

performing a mask trimming process to trim the mask layer from the third width to the second width at a second temperature in the same processing chamber, wherein the mask layer with the second width maintains covering the first side portion but not the second side portion of the shaped structure to leave the second side portion of the shaped structure exposed for etching, wherein the second temperature is greater than the first temperature; and performing an etching process using the trimmed mask layer as an etching mask to remove the second side portion of the shaped structure, wherein the etching process is continually performed until an exposed lower portion and the second side portion unshielded by the trimmed mask layer are removed from the substrate while leaving the first side portion adjacent to the fin structure intact.

2. The method of claim 1, wherein the second width is between about 20% and about 50% shorter than the third width.

3. The method of claim 1, wherein the epitaxial deposition process is performed in an epitaxial deposition chamber.

4. The method of claim 1, wherein the processing chamber where the mask layer deposition process and the mask trimming process are performed is a high density plasma (HDP) deposition chamber.

5. The method of claim 4, wherein the epitaxial deposition process is performed in an epitaxial deposition chamber and the epitaxial deposition chamber and the HDP deposition chamber are integrated in a cluster system.

6. The method of claim 1, wherein the shaped structure is a diamond like structure comprising silicon materials.

7. The method of claim 1, wherein the mask layer deposition process further comprises:
supplying a deposition gas mixture including a hydrocarbon compound in to a high density plasma chamber; and
maintaining a first substrate temperature between about 25 degrees and about 55 degrees Celsius while forming the mask layer on the substrate.

8. The method of claim 7, wherein the mask trimming process further comprises:
supplying a mask trimming gas mixture including a hydrogen containing gas in to the high density plasma chamber; and
maintaining a second substrate temperature between about 150 degrees and about 250 degrees Celsius while trimming the mask layer on the substrate.

9. The method of claim 8, wherein the second substrate temperature is averagely between about 400% and about 600% higher than the first substrate temperature.

10. The method of claim 8, wherein maintaining the substrate temperature further comprising:
turning off a back side cooling mechanism in a substrate member disposed in the high density plasma chamber where the substrate is disposed on.

11. The method of claim 7, wherein maintaining the substrate temperature further comprising:
cooling a back side of the substrate disposed in the high density plasma chamber.

12. The method of claim 1, further comprising:
performing an ashing process to remove the mask layer from the substrate.

13. The method of claim 1, wherein performing the etching process further comprises:
supplying an etching gas mixture including a halogen containing gas in a high density plasma chamber; and
maintaining a substrate temperature between about 25 degrees and about 35 degrees Celsius while removing the mask layer from on the substrate.

14. The method of claim 13, further comprising:
cooling a back side of the substrate disposed in the high density plasma chamber while etching.

15. The method of claim 12, wherein performing the ashing process further comprises:
supplying an ashing gas mixture including an oxygen containing gas in a high density plasma chamber; and
maintaining a substrate temperature between about 25 degrees and about 35 degrees Celsius by turning on a back side cooling mechanism in a substrate member disposed in the high density plasma chamber where the substrate is disposed on.

16. A method for forming a structure on a substrate, the method comprising:
forming a shaped structure, on a fin structure having a first width, the shaped structure comprising a first side portion adjacent to the fin structure and having a second width greater than the first width, and comprising a second side portion adjacent to the first side portion and having a third width greater than the second width, the shaped structure disposed on a substrate by an epitaxial deposition process;
maintaining the substrate at a first substrate temperature while forming a mask layer on the shaped structure on the fin structure and having the third width in a processing chamber, wherein the mask layer covers a first side portion and the second side portion of the shaped structure;
maintaining the substrate at a second substrate temperature while trimming the mask layer on the shaped structure on the fin structure, wherein the trimmed mask layer covers the first side portion but not the side portion of the shaped structure to leave the second side portion of the shaped structure exposed for etching, wherein the second substrate temperature is greater than the first substrate temperature in the same processing chamber;
maintaining the substrate at a third substrate temperature while etching the second side portion of the shaped substrate exposed by the trimmed mask layer by an etching process using the trimmed mask layer as an etching mask, wherein the third substrate temperature is lower than the second substrate temperature,
wherein the etching process is continually performed until an exposed lower portion and the second side portion unshielded by the trimmed mask layer are removed from the substrate while leaving the first side portion adjacent to the fin structure intact.

17. The method of claim 16, wherein maintaining the substrate at the first substrate temperature further comprising:
turning on a back side cooling mechanism in a substrate member supporting the substrate disposed in the processing chamber and the processing chamber is a high density plasma chamber.

18. The method of claim 16, wherein maintaining the substrate at the second substrate temperature further comprising:
- turning off a back side cooling mechanism in a substrate member supporting the substrate disposed in a high density plasma chamber.

19. The method of claim 16, wherein the shaped structure is a diamond like structure comprising silicon materials.

* * * * *

UNITED STATES PATENT AND TRADEMARK OFFICE
CERTIFICATE OF CORRECTION

PATENT NO. : 10,128,337 B2
APPLICATION NO. : 15/173234
DATED : November 13, 2018
INVENTOR(S) : Jie Zhou et al.

Page 1 of 1

It is certified that error appears in the above-identified patent and that said Letters Patent is hereby corrected as shown below:

In the Drawings

On Sheet 5 of 8, in Figure 5, reference numeral 504, Line 1, delete "PERFORMING G A EPI-SI" and insert -- PERFORMING AN EPI-SI --, therefor.

Signed and Sealed this
First Day of January, 2019

Andrei Iancu
*Director of the United States Patent and Trademark Office*